United States Patent
Foster et al.

[11] Patent Number: 5,593,511
[45] Date of Patent: Jan. 14, 1997

[54] METHOD OF NITRIDIZATION OF TITANIUM THIN FILMS

[75] Inventors: Robert F. Foster, Phoenix; Joseph T. Hillman, Scottsdale, both of Ariz.

[73] Assignees: Sony Corporation, Tokyo, Japan; Materials Research Corporation, Park Ridge, N.J.

[21] Appl. No.: 567,830

[22] Filed: Dec. 6, 1995

Related U.S. Application Data

[63] Continuation of Ser. No. 253,394, Jun. 3, 1994, abandoned.

[51] Int. Cl.$^6$ ................................................. C23C 8/20
[52] U.S. Cl. ........................ 148/238; 148/237; 437/238
[58] Field of Search .................................. 148/238, 237, 148/669; 427/38, 39, 228; 437/238; 204/192.1

[56] References Cited

U.S. PATENT DOCUMENTS

| | | | |
|---|---|---|---|
| 4,138,306 | 2/1979 | Niwa | 156/345 |
| 4,151,325 | 4/1979 | Welch | 428/432 |
| 4,178,877 | 12/1979 | Kudo | 118/728 |
| 4,282,267 | 8/1981 | Kuyel | 427/38 |
| 4,352,834 | 10/1982 | Taketoshi et al. | 427/38 |
| 4,365,587 | 12/1982 | Hirose et al. | 428/421 |
| 4,366,208 | 12/1982 | Akai et al. | 427/160 |
| 4,504,518 | 3/1985 | Ovshinsky et al. | 427/38 |
| 4,532,199 | 7/1985 | Ueno et al. | 427/38 |
| 4,535,000 | 8/1985 | Gordon | 430/128 |
| 4,557,943 | 12/1985 | Rosler et al. | 427/160 |
| 4,657,774 | 4/1987 | Satou et al. | 427/38 |
| 4,678,679 | 7/1987 | Ovshinsky | 427/38 |
| 4,689,093 | 8/1987 | Ishihara et al. | 437/5 |
| 4,701,349 | 10/1987 | Koyanagi et al. | 427/228 |
| 4,702,934 | 10/1987 | Ishihara et al. | 427/39 |
| 4,716,048 | 12/1987 | Ishihara et al. | 427/39 |
| 4,717,584 | 1/1988 | Aoki et al. | 427/38 |
| 4,717,585 | 1/1988 | Ishihara et al. | 427/39 |
| 4,717,586 | 1/1988 | Ishihara et al. | 427/39 |
| 4,718,976 | 1/1988 | Fujimura | 156/643 |
| 4,726,963 | 2/1988 | Ishihara et al. | 427/39 |
| 4,728,528 | 3/1988 | Ishihara et al. | 427/39 |
| 4,759,947 | 7/1988 | Ishihara et al. | 427/38 |
| 4,772,486 | 9/1988 | Ishihara et al. | 427/39 |
| 4,774,195 | 9/1988 | Beneking | 437/16 |
| 4,778,692 | 10/1988 | Ishihara et al. | 427/53.1 |
| 4,784,874 | 11/1988 | Ishihara et al. | 427/49 |
| 4,792,378 | 12/1988 | Rose et al. | 156/643.1 |
| 4,798,165 | 1/1989 | deBoer et al. | 118/725 |
| 4,801,468 | 1/1989 | Ishihara et al. | 427/35 |
| 4,803,093 | 2/1989 | Ishihara et al. | 427/38 |
| 4,818,560 | 4/1989 | Ishihara et al. | 427/38 |
| 4,818,563 | 4/1989 | Ishihara et al. | 427/55 |
| 4,835,005 | 5/1989 | Hirooka et al. | 427/250 |
| 4,844,950 | 7/1989 | Saitoh et al. | 428/658 |
| 4,851,302 | 7/1989 | Nakagawa et al. | 118/722 |
| 4,853,251 | 8/1989 | Ishihara et al. | 427/38 |
| 4,869,923 | 9/1989 | Yamazaki | 427/38 |

(List continued on next page.)

FOREIGN PATENT DOCUMENTS 3711790 11/1987 Germany.

OTHER PUBLICATIONS

Wolf, Stanley, Ph.D. and Richard N. Tauber, Ph.D., Silicon Processing for the VLSI Era, vol. 1, Process Technology, Dec. 1986, Lattice Press, Senset Beach, CA, pp. 574–577.

Dec. 1987 Proceedings Fourth International IEEE VLSI Multilevel Interconnection Conference IEEE Catalog No. 87CH2488-5, Jun. 15–15, 1987 Santa Clara, CA.

*Primary Examiner*—Scott Kastler
*Attorney, Agent, or Firm*—Wood, Herron & Evans, P.L.L.

[57] ABSTRACT

Titanium films are nitrided at temperatures less than 650° C., and preferably between 400° C. and 500° C., by treating the titanium film with a plasma formed from a nitriding gas at elevated temperatures. The plasma is created by subjecting the nitriding gas to RF energy, preferably an electrode having a frequency of 13.56 MHz or less. The reaction temperature can be reduced by lowering the plasma frequency to less than 500 KHz. This provides for nitridization at temperatures of 480° C. and lower.

10 Claims, 1 Drawing Sheet

5,593,511
Page 2

U.S. PATENT DOCUMENTS

| | | | |
|---|---|---|---|
| 4,869,924 | 9/1989 | Ito | 427/39 |
| 4,870,030 | 9/1989 | Markunas et al. | 437/81 |
| 4,876,983 | 10/1989 | Fukuda et al. | 427/38 |
| 4,885,067 | 12/1989 | Doty | 204/157.6 |
| 4,886,683 | 12/1989 | Hoke et al. | 427/232 |
| 4,888,062 | 12/1989 | Nakagawa et al. | 136/258 |
| 4,888,088 | 12/1989 | Slomowitz | 156/643 |
| 4,898,118 | 2/1990 | Murakami et al. | 118/723 |
| 4,900,694 | 2/1990 | Nakagawa | 437/109 |
| 4,908,329 | 3/1990 | Kanai et al. | 437/101 |
| 4,908,330 | 3/1990 | Arai et al. | 437/170 |
| 4,913,929 | 4/1990 | Moslehi et al. | 427/39 |
| 4,914,052 | 4/1990 | Kanai | 427/39 |
| 4,926,229 | 5/1990 | Nakagawa et al. | 357/30 |
| 4,927,786 | 5/1990 | Nishida | 437/233 |
| 4,937,094 | 6/1990 | Doehler et al. | 136/258 |
| 4,946,514 | 8/1990 | Nakagawa et al. | 427/38 |
| 4,951,602 | 8/1990 | Kanai | 118/719 |
| 4,954,397 | 9/1990 | Amada et al. | 430/58 |
| 4,957,772 | 9/1990 | Saitoh et al. | 427/35 |
| 4,959,106 | 9/1990 | Nakagawa et al. | 136/258 |
| 4,971,832 | 11/1990 | Arai et al. | 427/39 |
| 4,977,106 | 12/1990 | Smith | 437/192 |
| 4,987,102 | 1/1991 | Nguyen et al. | 437/238 |
| 4,992,305 | 2/1991 | Erbil | 427/252 |
| 4,992,839 | 2/1991 | Shirai | 357/23 |
| 4,998,503 | 3/1991 | Murakami et al. | 118/723 |
| 5,002,617 | 3/1991 | Kanai et al. | 136/250 |
| 5,002,618 | 3/1991 | Kanai et al. | 136/258 |
| 5,002,793 | 3/1991 | Arai | 427/38 |
| 5,002,796 | 3/1991 | Nishida | 427/45.1 |
| 5,006,180 | 4/1991 | Kanai et al. | 136/258 |
| 5,007,971 | 4/1991 | Kanai et al. | 136/258 |
| 5,008,726 | 4/1991 | Nakagawa et al. | 357/50 |
| 5,010,842 | 4/1991 | Oda et al. | 118/723 |
| 5,018,479 | 5/1991 | Markunas et al. | 118/723 |
| 5,024,706 | 6/1991 | Kanai et al. | 136/258 |
| 5,028,488 | 7/1991 | Nakagawa et al. | 428/457 |
| 5,030,475 | 7/1991 | Ackermann et al. | 427/39 |
| 5,037,666 | 8/1991 | Mori | 427/38 |
| 5,039,354 | 8/1991 | Nakagawa et al. | 136/249 |
| 5,061,511 | 10/1991 | Saitoh et al. | 427/38 |
| 5,073,232 | 12/1991 | Ohmi et al. | 156/646 |
| 5,084,412 | 1/1992 | Nagasaki | 437/189 |
| 5,085,885 | 2/1992 | Foley et al. | 427/38 |
| 5,087,542 | 2/1992 | Yamazaki et al. | 430/60 |
| 5,093,149 | 3/1992 | Doehler et al. | 427/38 |
| 5,093,150 | 3/1992 | Someno et al. | 427/38 |
| 5,093,710 | 3/1992 | Higuchi | 351/71 |
| 5,100,495 | 3/1992 | Ohmi et al. | 427/255.1 |
| 5,122,431 | 6/1992 | Kodama et al. | 430/128 |
| 5,126,169 | 6/1992 | Ishihara et al. | 427/38 |
| 5,130,170 | 7/1992 | Kanai et al. | 427/38 |
| 5,139,825 | 8/1992 | Gordon et al. | 427/255.2 |
| 5,141,613 | 8/1992 | Adoncecchi et al. | 204/192.1 |
| 5,151,296 | 9/1992 | Tokunaga | 118/719 |
| 5,154,135 | 10/1992 | Ishihara | 427/573 |
| 5,173,327 | 12/1992 | Sandhu et al. | 427/8 |
| 5,175,017 | 12/1992 | Kobayashi et al. | 427/523 |
| 5,178,904 | 1/1993 | Ishihara et al. | 427/570 |
| 5,178,905 | 1/1993 | Kanai et al. | 118/723 |
| 5,180,435 | 1/1993 | Markunas et al. | 437/173 |
| 5,213,997 | 5/1993 | Ishihara et al. | 257/40 |
| 5,220,181 | 6/1993 | Kanai et al. | 437/81 |
| 5,268,034 | 12/1993 | Vukelic | 118/725 |
| 5,296,404 | 3/1994 | Akahori et al. | 437/192 |
| 5,342,652 | 8/1994 | Foster et al. | |
| 5,356,476 | 10/1994 | Foster et al. | 118/720 |
| 5,370,739 | 12/1994 | Foster et al. | |
| 5,378,501 | 1/1995 | Foster et al. | 427/255.2 |
| 5,434,110 | 7/1995 | Foster et al. | 437/245 |

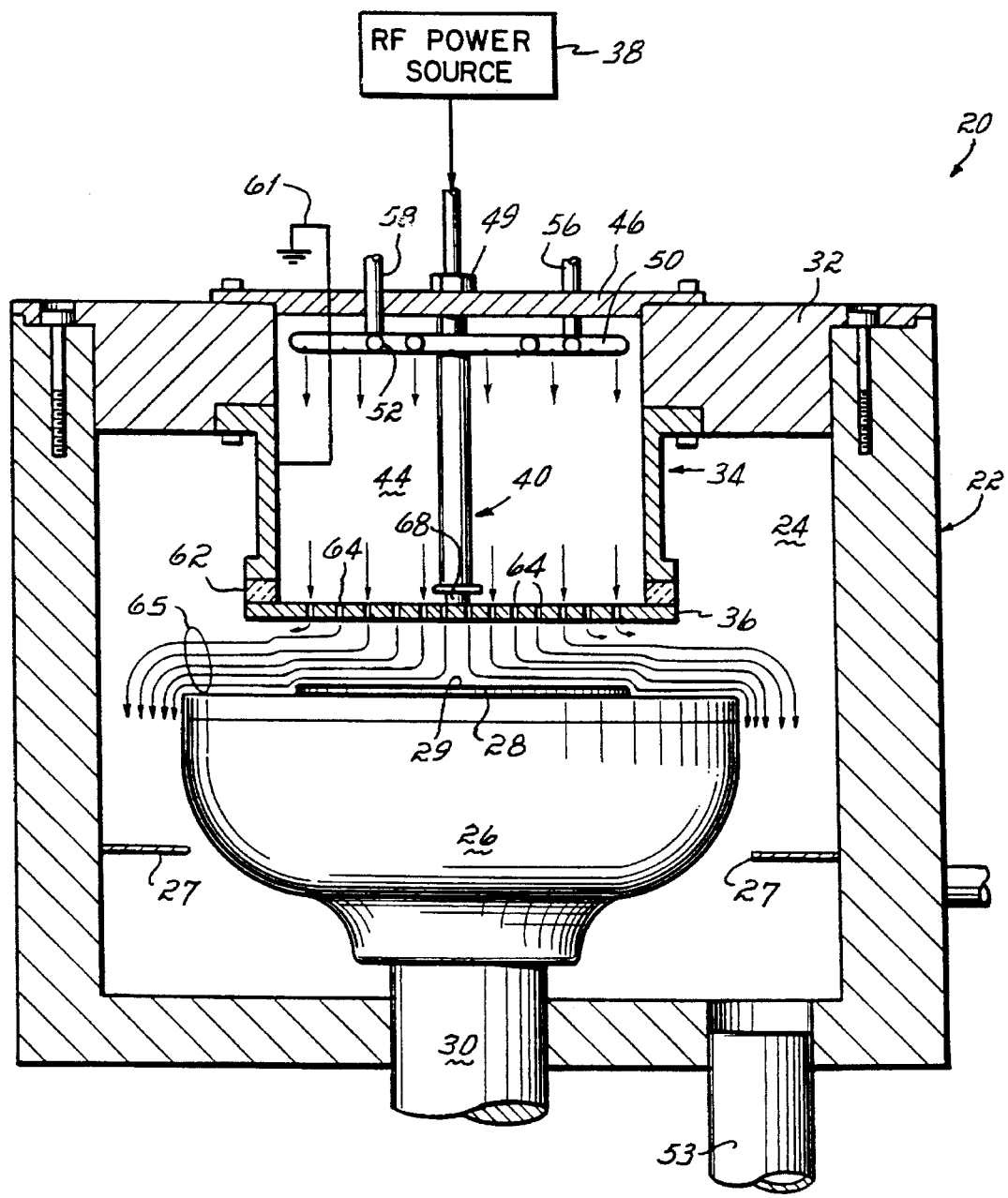

METHOD OF NITRIDIZATION OF TITANIUM THIN FILMS

This application is a continuation of application Ser. No. 08/253,394, filed Jun. 3, 1994, now abandoned.

BACKGROUND OF THE INVENTION

In the formation of integrated circuits (IC's), thin films containing metal elements are often deposited upon the surface of a substrate, such as a semiconductor wafer. Thin films are deposited to provide conducting and ohmic contacts in the circuits and between the various devices of an IC. For example, a desired thin film might be applied to the exposed surface of a contact or via on a semiconductor wafer, with the film passing through the insulative layers on the wafer to provide plugs of conductive material for the purpose of making interconnections across the insulating layers.

Particularly, certain aspects of IC components are degraded by exposure to the high temperatures normally related to traditional thermal chemical vapor deposition (CVD) processes. At the device level of an IC, there are shallow diffusions of semiconductor dopants which form the junctions of the electrical devices within the IC. The dopants are often initially diffused using heat during a diffusion step, and therefore, the dopants will continue to diffuse when the IC is subjected to a high temperature during CVD. Such further diffusion is undesirable because it causes the junction of the device to shift, and thus alters the resulting electrical characteristics of the IC. Therefore, for certain IC devices, exposing the substrate to processing temperatures of above 800° C. must be avoided, and the upper temperature limit may be as low as 650° C. for other more temperature sensitive devices.

Furthermore, such temperature limitations may become even more severe if thermal CVD is performed after metal interconnection or wiring has been applied to the IC. For example, many IC's utilize aluminum as an interconnection metal. However, various undesirable voids and extrusions occur in aluminum when it is subjected to high processing temperatures. Therefore, once interconnecting aluminum has been deposited onto an IC, the maximum temperature to which it can be exposed is approximately 500° C., and the preferred upper temperature limit is 400° C. Therefore, as may be appreciated, it is desirable during CVD processes to maintain low deposition temperatures whenever possible.

In one particular application, a thin film of titanium must be deposited over silicon contacts prior to depositing the metal interconnection in order to provide low contact resistance. In state-of-the-art integrated circuits, this titanium deposition is followed by the deposition of a titanium nitride (TIN) diffusion barrier layer. The diffusion barrier prevents aluminum interconnection from diffusing into the silicon contact and causing a short circuit. The diffusion barrier is also needed in the case of tungsten metalization. In this case, the TiN diffusion barrier prevents the tungsten precursor, tungsten hexafluoride, from diffusing into the silicon contact and reacting with the silicon.

There are low temperature physical techniques available for depositing titanium nitride (TIN) on temperature sensitive substrates. Sputtering is one such technique involving the use of a target of layer material and an ionized plasma. To sputter deposit a film, the target is electrically biased and ions from the plasma are attracted to the target to bombard the target and dislodge target material particles. The particles then deposit themselves cumulatively as a film upon the substrate. Titanium Nitride may be sputtered, for example, over a silicon substrate after various contacts or via openings are cut into a level of the substrate.

The conformality of sputtered TiN is poor in the high aspect ratio contacts which are used in state-of-the-art integrated circuits. This poor conformality leads to poor diffusion barrier properties. Therefore, TiN films deposited by chemical vapor deposition (CVD) are preferred over sputtered films. TiN films deposited by CVD from $TiCl_4$ and $NH_3$ provide 100% conformality over very high aspect ratio contacts.

The HCl which is a byproduct of this TiN deposition reaction can etch the titanium contact layer. In order to avoid etching of the titanium, the upper layer of the titanium must be nitrided prior to TiN CVD. This nitridization can be done by rapid thermal annealing at 800° C. in a nitrogen or ammonia ambient. This temperature is far too high for the shallow junctions which are present in most state-of-the-art integrated circuits. Therefore, a low temperature nitridation process is necessary. Annealing the titanium film in ammonia at 650° C. results in a very poor quality nitridation of the titanium surface as evidenced by the lack of a characteristic gold color. When TiN is deposited by chemical vapor deposition over the thermally annealed titanium, the result is the same as with the unannealed titanium. Prior attempts at annealing using an ammonia plasma have been unsuccessful.

SUMMARY OF THE INVENTION

The invention provides a process for nitriding thin films of titanium at temperatures ranging from 400° C. to 650° C. More particularly, the present invention provides a method to nitride a titanium film using an ammonia anneal at less than 650° C. Using an RF ammonia plasma results in an improved outcome, permitting the lower temperatures. Further, generating the plasma near the titanium surface significantly improves the nitridization.

When a titanium film is annealed in a 13.56 KHz ammonia plasma at 650° C. the surface of the titanium turns gold in color indicating that the surface has been converted to TiN. When TiN is deposited by chemical vapor deposition over the plasma annealed film, the result is a smooth and conformal film with no evidence of pitting, cracking or delamination. This is apparently because the thin titanium nitride layer formed on the surface of the titanium is protecting the titanium from HCl attack.

A preferred embodiment of the present invention utilizes a showerhead affixed to the end of a cylinder which is biased with RF energy to create a plasma of ammonia or nitrogen passing through the nozzle. The showerhead RF electrode is located close to a rotating susceptor which rotates a titanium-coated substrate.

The gas to be activated is introduced into the cylinder and travels through the showerhead and through the RF field of the showerhead where it is excited into a plasma as it is dispersed through the openings of the showerhead uniformly over the surface of the substrate. The rotating susceptor rotates the substrate and pumps the plasma along the substrate in a laminar flow pattern to ensure maximum radical concentration at the surface of the titanium film. The cylinder improves the flow pattern of the gas to enhance the laminar flow delivery.

Reducing the frequency of the RF plasma further improves the affect of the anneal, When the film is annealed in an ammonia plasma created by a 450 KHz electrode the temperature can be significantly reduced, i.e., to less than 500° C. The gold color achieved with this anneal is deeper than the gold color achieved at 650° C. and 13.56 MHz. This indicates a higher quality TiN surface layer has been formed, and suggests that the anneal temperature can be further reduced when a low frequency RF plasma is used.

The invention and the particular advantages and features of the present invention will now be described in detail below with reference to the accompanying drawings.

BRIEF DESCRIPTION OF THE DRAWING

The FIGURE is a side view, partially in cross-section of a deposition chamber used to practice the methods of the present invention.

DETAILED DESCRIPTION OF THE INVENTION

According to the present invention, a titanium film is nitrided by treating it with a plasma created from a nitriding gas such as nitrogen or, preferably, ammonia. According to the present invention, the titanium film may be formed over a variety of different semiconductor substrates. These would include silicon, thermal oxides and ceramics. The titanium film can also be deposited over patterned wafers including those having contacts with silicon and aluminum. The particular surface upon which the titanium is deposited and the method of depositing the titanium film do not form part of the present invention.

Two nitriding gases can be used in the present invention. These are ammonia and nitrogen. Ammonia is preferred because of its better reactivity. The plasma is created by simply subjecting the nitriding gas to an RF electrode at elevated temperature and reduced pressure. The titanium film is then contacted with this plasma, thereby forming titanium nitride.

Preferably for use in the present invention, the RF electrode will have a minimum power of 100 watts. The maximum power is the power at which devices are damaged, i.e., about 5 Kilowatts. Approximately 250 watts is adequate, The frequency of the RF electrode should be from about 55 MHz to about 33 KHz, As the frequency is lowered, the temperature of the treatment can also be reduced, The upper frequency is a function of Federal Communication Commission regulation and equipment availability. However, as described below, lower frequencies are generally preferred.

In order to preserve the underlying titanium film and substrate, the temperature should be kept at less than 650° C. As the frequency of the electrode is reduced, the temperature can also be reduced. Generally, the reaction temperature can vary from about 650° C. down to about 300° C. Preferably, the temperature will be less than 500° C., preferably from about 400° to about 450° C., which will provide for excellent nitridization and reduce thermal degradation of the underlying substrate and titanium film. By lowering the RF frequency, the temperature can also be lowered. As the frequency is reduced to less than 500 KHz, the temperature can be reduced below 500° C. At 450 KHz, the temperature can be 450° C.

The time, pressure and flow rates, as well as temperature, can all be varied to increase or decrease the reaction rate of the nitridization. Generally, the minimum flow rate of the nitridization gas should not be less than about 10 sccm. At flow rates above 5,000 sccm there is increased unvented gas without any benefit although flow rates above 10,000 sccm will function. But precise flow rate is not critical for practicing the present invention. Therefore, about 1,000 sccm is preferred. The time can range from 20 seconds up to ten minutes, however 5 minutes is generally acceptable.

The reaction pressure must be subatmospheric and generally will vary from about 500 millitorr to about 1 torr. If one desired to decrease the time, the flow rate and temperature could be increased. Likewise, with reduced temperature increased time is preferred. Likewise, when reducing the temperature, the RF frequency can also be reduced. Plasma power can be increased or decreased, likewise, to alter the time or reaction rate.

Although not limited to any particular apparatus, one preferred apparatus for use in the present invention is a chemical vapor deposition reactor 20 shown in the FIGURE. Alternate embodiments of the reaction are disclosed in U.S. Patent Application entitled "Method and Apparatus for the Efficient Use of Reactant Gases and Plasmas for Depositing CVD and PECVD Films," filed on even date herewith and listing Robert F. Foster, Joseph T. Hillman, Rikhit Arora as inventors. The disclosure of this application is incorporated herein by reference.

Reactor 20, and specifically reaction space 24 within housing 22, may be selectively evacuated to various different internal pressures—for example, from 0.5 to 100 Torr. The susceptor 26 is coupled to a variable speed motor (not shown) by shaft 30 such that the susceptor 26 and substrate 28 may be rotated at various speeds such as between 0 and 2,000 rpm. Susceptor 26 includes a resistance heating element (not shown) coupled to the susceptor 26 to heat substrate 28 to between 200° and 800° C.

Extending downwardly from the top wall 32 of housing 22 is a cylinder assembly 34 which is attached to a gas-dispersing showerhead 36.

Showerhead 36 is coupled to an RF energy source 38 by an appropriate RF feedline assembly 40 which extends through cover 46 which may, if necessary, include a heat pipe to dissipate unwanted heat. A sealing structure 49 seals the opening around feedline assembly 40. Plasma and reactant gases are introduced into flow passage 44 by concentric rings or halos 50, 52. The concentric rings 50, 52 include a number of holes which evenly dispense the gases around the flow passage 44. Ring 50 is connected to a gas supply through line 56, while ring 52 is connected to a supply by line 58.

An insulator ring 62 separates cylinder 34 and showerhead 36 for reasons discussed hereinbelow. Cylinder 34 is electrically grounded by ground line 61.

The insulator ring 62 preferably has an outer diameter approximately the same as the outer diameter of showerhead 36 and a width dimension which ensures complete separation of cylinder 34 and showerhead 36 along the entire attachment interface between the cylinder and showerhead. The insulator ring is preferably made of quartz material approximately 0.75 inches thick.

Showerhead/electrode 36 contains a plurality of dispersion holes 64 which disperse the flow of gas over substrate 28.

The showerhead 36 includes a stem 68. Stem 68 is formed integrally with the showerhead 36 and forms part of the RF line assembly 40 which connects to showerhead 36. The showerhead 36, including stem 68, is formed of an electrically conductive material, preferably Nickel-200. As may be appreciated, other conductive materials may also be appropriate.

The RF power source, through RF feedline assembly 40, biases the showerhead 36 so that the showerhead functions as an RF electrode, The grounded susceptor 26 forms another parallel electrode. An RF field is created, preferably between showerhead 36 and susceptor 26. Hereinafter in the application, showerhead 36 will be referred to as showerhead/electrode 36 when referring to a biased showerhead 36 in accordance with the principles of the present invention. The RF field created by the biased showerhead/electrode 36 excites the plasma gases which are dispensed through holes 64 so that a plasma is created below showerhead/electrode 36.

The showerhead employed is about 0.25 inches thick, having a diameter of about 17.3 cm and 600 holes. The number of holes is not critical and could easily be varied from 100 holes to 1,000 or more holes. The holes are preferably less than 1.5 mm in diameter and are more preferably about 0.75 min. This prevents the plasma from being generated in the hole, thereby reducing efficiency.

The gas flow from injector rings 50 and 52 is allowed to develop within the length of the cylinder 34 as it travels to the showerhead 36. It is desirable for the velocity profile of the incoming plasma gases passing through showerhead 36 to be fully developed before they reach the rotating surface of the substrate 28. Due to the proximity of the showerhead to the surface, that profile must develop in the cylinder 34.

Utilizing cylinder 34 shown in the FIGURE, the showerhead-to-susceptor spacing may be reduced to approximately 30 to 20 mm or less because the velocity profile develops in cylinder 34, Therefore, the length of cylinder 34 from the injector rings 50 and 52 to showerhead 36 should be 40 to 100 mm. As the gases pass through the showerhead 36, the pressure drop across the showerhead 36 flattens out the velocity profile of the gases. As the gases approach showerhead/electrode 36 and pass therethrough, they are excited into a plasma which contacts surface 29.

The showerhead 36 can be from about 10 cm to about 10 millimeters from the susceptor, with 20 mm preferred. It is preferred to have the showerhead as close as possible to the substrate while still permitting the substrate or wafer to be removed.

A pumping effect is created by the rotating susceptor 26. The plasma radicals and ions (nitrogen and hydrogen) are drawn to the upper surface 29 of substrate 28. Generally, the rotation rate can vary from 0 rpm to 1500 rpm. About 100 rpm is preferred. Further, matched flow does not appear to be critical but can be employed.

With a spacing of about 25 mm between the showerhead and the substrate 28, the created plasma is much closer to the titanium surface 29. With the showerhead 36 acting as an RF electrode, a more uniform plasma is generated, therefore enhancing the uniformity of radical and ion density at the substrate 28 and thereby improving nitridization reaction rate.

When employing this apparatus, the electrode is biased—generally at a frequency from about 13.56 MHz (a frequency which is authorized by the Federal Communication Commission)—down to about 400 KHz. The power of the electrode is generally set at about 250 watts. The substrate with the titanium coating is placed on the susceptor and heated to about 650° C. or less.

The nitridization gas, preferably ammonia, is introduced through injectors 50 and 52 and flows through the cylinder 34 and through showerhead 36, which creates the plasma from the gas. The flow rate of the gas into cylinder 34 is generally about 1,000 sccm and the pressure within the reaction chamber itself is maintained at about 1 to 3 torr (3 is preferred). The heated susceptor is rotated at a rotation rate of about 100 rpm which, in effect, pumps gas laterally away from the titanium surface 29 as the plasma is forced downwardly toward the titanium surface. This reaction continues for about five minutes. Unreacted ammonia, along with hydrogen, will (as shown by arrows 65) be pulled around baffles 27 and from the reaction chamber 14 through vent 53.

The titanium film 29 will take on a gold luster, indicating the formation of titanium nitride. The titanium nitride film can then be further treated in the reaction chamber or can be removed to a separate chamber for further treatment.

If treated in this reaction chamber, one preferred further treatment would be the plasma-enhanced chemical vapor deposition of titanium nitride, using as reactants titanium tetrachloride, and nitrogen or ammonia.

The present invention will be further appreciated in light of the following examples:

EXAMPLE 1

A plasma vapor deposited titanium film was annealed under the following conditions:

| | |
|---|---|
| Substrate temperature | 550° C. (650° C. susceptor) |
| Plasma power | 250 watts |
| Plasma frequency | 15.5 MHz |
| Ambient gas ammonia flow rate | 1000 sccm |
| Pressure | 1 torr |
| Time | 5 minutes |
| Rotation Rate | 100 rpm |

The annealed titanium film was removed from the reaction chamber and inspected. The silver-grey color of the titanium had taken on a dull yellow-gold that indicated conversion to titanium nitride.

The film was loaded back into the reaction chamber for chemical vapor deposition of titanium nitride using a two-step deposition at 480° C.

In step 1, the process was run in $TiCl_4$ depletion, i.e., $TiCl_4$ flow rate of 20 sccm, 500 sccm $NH_3$, 5 liters per minute $N_2$. Approximately 100 angstroms of TiN was deposited with an expected chlorine content of 3% and less than 100% conformality. In step 2, the $TiCl_4$ flow is turned up into the saturation regime, 80 sccm $TiCl_4$ with $NH_3$ and $N_2$ rates constant. In this step, 400 angstroms of TiN is deposited with 4.5% chlorine and 100% conformality.

In this case, the result was an excellent quality TiN deposition over the nitrided titanium film.

EXAMPLE 2

A plasma vapor deposited titanium film was annealed at about 450° C. (520° C. susceptor). The other anneal conditions were as follows:

| | |
|---|---|
| Substrate temperature | 450° C. (520° C. susceptor) |
| Plasma power | 250 watts |
| Plasma frequency | 440 KHz |
| Ambient gas ammonia flow rate | 1000 sccm |
| Pressure | 1 torr |
| Time | 5 minutes |
| Rotation Rate | 100 rpm |

After annealing, the sample was removed for inspection, The color had changed to a deep gold. This indicated that a higher quality titanium nitride was formed despite the reduction in temperature.

After inspection, the sample was placed back into the CVD chamber for TiN deposition. The deposition process was exactly the same as described in Example 1. The result was an excellent TiN deposition over the annealed titanium, No cracking, peeling or pitting were observed.

Thus, by employing the method of the present invention the temperature of the anneal can actually be reduced by decreasing the frequency, This, in turn, improves the nitridization reaction, thereby preventing degradation of the underlying substrate.

This has been a description of the present invention, along with the preferred embodiment of practicing the present invention. However, the invention itself should only be defined by the appended claims wherein

We claim:

1. A method of applying a titanium nitride layer over a titanium film comprising:

exposing said titanium film to a plasma selected from the group consisting of a nitrogen plasma and an ammonia plasma at a temperature less than about 500° C. for 20 to 300 seconds, wherein said plasma is created by subjecting a nitriding gas selected from the group consisting of ammonia and nitrogen to an Rf electrode, thereby forming a titanium nitride layer on said titanium film;

and depositing on said titanium nitride layer a titanium nitride film by chemical vapor deposition wherein said titanium nitride film is formed from titanium tetrachloride and a gas selected from the group consisting of nitrogen, ammonia and mixtures of nitrogen and ammonia.

2. The method claimed in claim 1 wherein said nitriding gas is ammonia.

3. The method claimed in claim 1 wherein said RF electrode has a frequency of 400 KHz to about 33 MHz.

4. The method claimed in claim 2 wherein said temperature is less than about 500° C. and said frequency is less than about 500 KHz.

5. The method claimed in claim 1 wherein said nitriding gas is passed in contact with said RF electrode at a flow rate of from about 10 sccm to about 10,000 sccm.

6. The method claimed in claim 5 wherein said plasma frequency is less than about 500 KHz and said temperature is less than about 500° C.

7. The method claimed in claim 1 wherein said plasma is created by passing said gas through a showerhead nozzle above said titanium film and wherein said plasma is generated at said showerhead.

8. The method claimed in claim 7 wherein said showerhead is an RF electrode and said plasma is generated by said showerhead as nitridization gas passes through said showerhead.

9. The method claimed in claim 7 wherein said nitridization gas is introduced into a flow chamber and develops a flow profile within said chamber, wherein said RF electrode comprises a showerhead and said plasma is created as said gas passes through said showerhead.

10. The method claimed in claim 1 wherein said RF electrode is positioned from about 10 cm to about 10 mm from said titanium film.

* * * * *